(12) United States Patent
Gearhardt et al.

(10) Patent No.: US 7,106,074 B2
(45) Date of Patent: Sep. 12, 2006

(54) TECHNIQUE FOR MEASUREMENT OF PROGRAMMABLE TERMINATION RESISTOR NETWORKS ON RAPIDCHIP AND ASIC DEVICES

(75) Inventors: Kevin Gearhardt, Fort Collins, CO (US); Anita Greeb, Fort Collins, CO (US); Doug Feist, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/954,907

(22) Filed: Sep. 30, 2004

(65) Prior Publication Data

US 2006/0066320 A1    Mar. 30, 2006

(51) Int. Cl.
*G01R 27/08* (2006.01)
*G01R 31/02* (2006.01)

(52) U.S. Cl. ...................... 324/691; 324/763
(58) Field of Classification Search ................ 324/691, 324/763
See application file for complete search history.

(56) References Cited

U.S. PATENT DOCUMENTS 5,773,967 A * 6/1998 Tenten ........................ 323/313
6,603,326 B1 * 8/2003 Tse et al. .................... 324/765
2002/0063576 A1 * 5/2002 Kim et al. ..................... 326/30

\* cited by examiner

*Primary Examiner*—Anjan Deb
*Assistant Examiner*—John Teresinski
(74) *Attorney, Agent, or Firm*—Trexler, Bushnell, Giangiorgi, Blackstone & Marr, Ltd.

(57) ABSTRACT

A measurement technique which allows the error components of the testing process to be eliminated by performing a differential-style measurement of the programmable termination resistor network. Since for any given DUT pin which is to be tested, there are multiple possible resistances to be measured, the test process provides that two or more resistance measurements are taken on the same pin. Once those values containing the error components are obtained, they are compared to generate a differential resistance measurement which contains only the actual on-chip DUT resistance with the error components completely removed. The differential value can then be tested against previously defined test limits that are set to guarantee the conformance of the on-chip resistance to the processing specifications. The technique can be applied at either the wafer sort or package test phase of device testing, with the different error components associated with either phase being eliminated.

4 Claims, 2 Drawing Sheets

TECHNIQUE FOR MEASUREMENT OF PROGRAMMABLE TERMINATION RESISTOR NETWORKS ON RAPIDCHIP AND ASIC DEVICES

BACKGROUND

The present invention generally relates to the production test requirements for testing programmable termination resistor networks such as those used for Gigablaze® and other high speed serial interfaces.

The problem faced in the manufacturing test environment is that it is a non-ideal situation with respect to the contact resistance that occurs at multiple points between the tester's pin electronics and the actual device-under-test (DUT). These contact resistances are difficult to control at best, and cannot be completely eliminated. As such they contribute an error component to any resistance measurements that are to be made on the actual DUT. These errors in the measurements result in failing tests during the manufacturing test flow causing product yield issues.

The only existing solutions to the aforementioned problems involve the relaxation of test limits for the DUT, or the elimination of the test altogether. While this can address the manufacturing test problem, it provides the risk of shipping product out which is out of specification. Alternatively, the testing can be performed within the specified test limits, and the manufacturer is forced to accept any associated yield losses during the manufacturing test process.

OBJECTS AND SUMMARY

An object of an embodiment of the present invention is to provide a measurement technique allows the error components of the testing process to be effectively eliminated.

An object of an embodiment of the present invention is to provide a measurement technique which provides the ability to perform ATE resistance measurements of a DUT which represent only actual on-chip resistance values.

Briefly, and in accordance with at least one of the foregoing objects, an embodiment of the present invention provides a measurement technique which allows the error components of the testing process to be eliminated by doing a differential-style measurement of the programmable termination resistor network. Since for any given DUT pin which is to be tested, there are multiple possible resistances to be measured, the test process is modified to do two or more resistance measurements on the same pin. Once those values containing the error components are obtained, they can be compared to generate a differential resistance measurement which contains only the actual on-chip DUT resistance with the error components completely removed. The differential value can then be tested against previously defined test limits that are set to guarantee the conformance of the on-chip resistance to the processing specifications. The technique can be applied at either the wafer sort or package test phase of device testing, with the different error components associated with either of those phase being eliminated.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
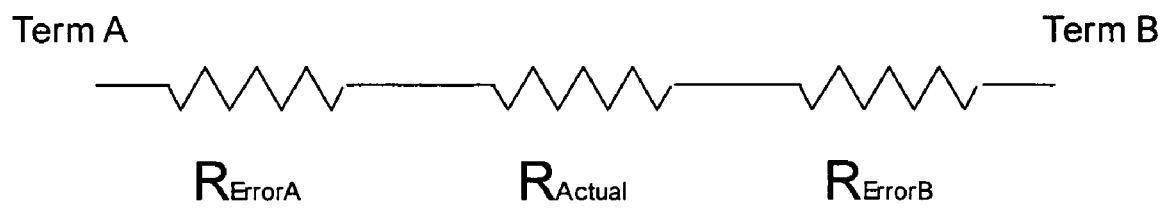
FIG. 1 illustrates typical resistance network which is to be measured on the DUT, including the error components which are an inherent part of the measurement process.

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

The present invention provides a measurement technique which allows the error components of the testing process to be effectively eliminated. The technique can be applied at either the wafer sort or package test phase of device testing, with the different error components associated with either of those phases being eliminated.

An embodiment of the present invention provides a measurement technique which allows the error components of the testing process to be eliminated by doing a differential-style measurement of the programmable termination resistor network. Since for any given DUT pin which is to be tested there are multiple possible resistances to be measured, the test process provides that two or more resistance measurements are taken on the same pin. Once those values containing the error components are obtained, they are compared to generate a differential resistance measurement which contains only the actual on-chip DUT resistance with the error components completely removed. The differential value can then be tested against previously defined test limits that are set to guarantee the conformance of the on-chip resistance to the processing specifications.

FIG. 1 represents the typical resistance network which is to be measured on the DUT, including the error components which are an inherent part of the measurement process. The labels 'Term A' and 'Term B' represent the contact points between the automated test equipment (ATE) pin electronics and the DUT. There are three resistance components shown in the diagram, $R_{ErrorA}$, $R_{Actual}$ and $R_{ErrorB}$. The error components of the measurement are unknowns in the manufacturing test environment, and their values will change through time as multiple devices are tested and the associated test fixturing becomes worn or dirty. However, for any given DUT being tested, the error components are a constant during any single contact between the ATE and DUT. This allows for the possibility of doing two or more measurements of the resistance network to obtain multiple readings of on-chip resistance as the value of $R_{Actual}$ is reprogrammed to its different possible values under the control of the ATE. Since the error components are a constant during this measurement process, then the difference between any two measurements obtained represents an actual on-chip resistance value which has no error component.

For example, suppose two measurements are made which are called Ra and Rb. Ra is equal to $R_{ErrorA}$+R1+$R_{ErrorB}$ where $R_{ErrorA}$ and $R_{ErrorB}$ are error components and R1 is an actual on-chip resistance. Rb is then equal to $R_{ErrorA}$+R2+$R_{ErrorB}$ where $R_{ErrorA}$ and $R_{ErrorB}$ are the same error components contained in Ra, and R2 is another actual on-chip resistance. Given the two values Ra and Rb, a difference can be generated which is (R1−R2). This value contains no error components since they are cancelled out when Rb is subtracted from Ra. Given this new value (R1−R2), it can be tested against previously specified limits which are set to ensure the device conforms to its design specifications.

Figure 2:
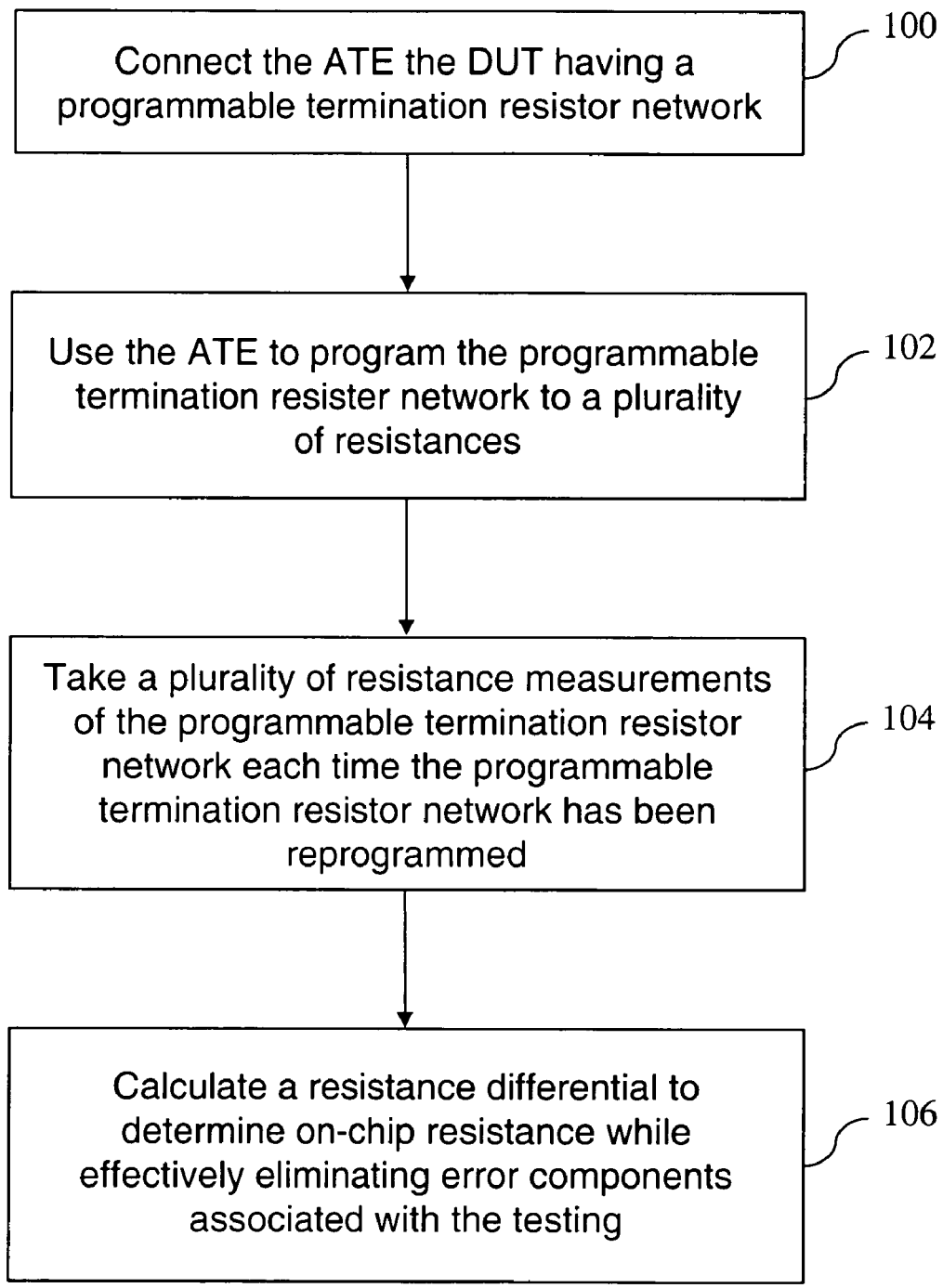
FIG. 2 illustrates a method which is in accordance with an embodiment of the present invention.

FIG. 2 illustrates a method which is in accordance with an embodiment of the present invention and is self-explanatory in light of the foregoing description, wherein reference numeral 100 identifies the step of connecting the ATE to the DUT having a programmable termination resistor network, reference numeral 102 identifies the step of using thd ATE to program the programmable termination resistor network to a plurality of resistances, reference numeral 102 identifies the step of talking a plurality of resistance measurements of the programmable termination resistor network each time the programmable termination resistor network has been reprogrammed, and reference numeral 106 identifies the step of calculating a resistance differential to determine on-chip resistance while effectively eliminating error components associated with the testing.

The primary feature of the present invention is the ability to perform ATE resistance measurements of a DUT which represent only actual on-chip resistance values. With the error components of these measurements cancelled out, a manufacturer can accurately test a device to ensure conformance to product specifications. This effectively eliminates the problems normally associated with such test techniques.

The primary advantage of the present invention is that the technique can be performed for any device which requires the testing of on-chip programmable termination resistor networks, and doing so requires no modifications to the DUT or test hardware being used. An additional advantage is that the technique can be applied at either the wafer sort or package test phase of device testing, with the different error components associated with either of those phases being eliminated.

While an embodiment of the present invention is shown and described, it is envisioned that those skilled in the art may devise various modifications of the present invention without departing from the spirit and scope of the appended claims.

What is claimed is:

1. A method for using automatic test equipment to test a device having a programmable termination resistor network, said method comprising: connecting the automatic test equipment to the device; using the automatic test equipment to program the programmable termination resistor network to a plurality of resistances; taking a first resistance measurement of the programmable termination resistor network and a second resistance measurement of the programmable termination resistor network each time the programmable termination resistor network has been reprogrammed by the automatic test equipment; and performing a subtraction operation with regard to the first and second resistance measurements thereby calculating a resistance differential based on the first and second resistance measurements to determine on-chip resistance while effectively eliminating error components associated with the testing.

2. A method as recited in claim 1, further comprising testing the resistance differential against pro-defined limits to ensure the device conforms to design specifications.

3. A method for using automatic test equipment to test a device having a programmable termination resistor network, said method comprising: connecting the automatic test equipment to the device; using the automatic test equipment to change the resistance of the programmable termination resistor network while taking a first resistance measurement and a second resistance measurement of the programmable termination resistor network; and performing a subtraction a operation with regard to the and second resistance measurements thereby calculating a resistance differential based on the first and second resistance measurements to determine on-chip resistance while effectively eliminating error components associated with the testing.

4. A method as recited in claim 3, further comprising testing the resistance differential against pre-defined limits to ensure the device conforms to design specifications.

* * * * *